United States Patent

Sogard et al.

[11] Patent Number: 6,126,169
[45] Date of Patent: Oct. 3, 2000

[54] AIR BEARING OPERABLE IN A VACUUM REGION

[75] Inventors: Michael R. Sogard, Menlo Park, Calif.; Denis F. Spicer, Bedford, United Kingdom

[73] Assignee: Nikon Corporation, Japan

[21] Appl. No.: 09/012,432

[22] Filed: Jan. 23, 1998

[51] Int. Cl.[7] .......................................... F16J 15/46
[52] U.S. Cl. ............................. 277/321; 277/431
[58] Field of Search .................... 277/431, 321; 384/12, 100, 114, 119

[56] References Cited

U.S. PATENT DOCUMENTS

| | | |
|---|---|---|
| 3,355,990 | 12/1967 | Thum . |
| 3,610,365 | 10/1971 | Maddox et al. . |
| 4,191,385 | 3/1980 | Fox et al. . |
| 4,425,508 | 1/1984 | Lewis, Jr. et al. ................. 250/442.1 |
| 4,502,693 | 3/1985 | Lesiecki et al. . |
| 4,534,569 | 8/1985 | Ishitani et al. . |
| 4,749,283 | 6/1988 | Yokomatsu et al. . |
| 5,106,204 | 4/1992 | Dunham . |
| 5,218,896 | 6/1993 | Furukawa . |
| 5,345,829 | 9/1994 | Yamauchi et al. ..................... 277/321 |
| 5,391,002 | 2/1995 | Eigenbrod . |

OTHER PUBLICATIONS

Masaru Ohtsuka et al., "The Vertical Traverse State in Vacuum Condition", SME International Journal, Series III, vol. 33, No. 1, 1990, pp. 61–64.

*Primary Examiner*—Anthony Knight
*Assistant Examiner*—John L. Beres
*Attorney, Agent, or Firm*—Skjerven Morrill MacPherson LLP; Norman R. Klivans

[57] ABSTRACT

An air bearing is usable in a vacuum, by restricting the air escaping from the air bearing to the immediate vicinity of the air bearing. This is accomplished by one or more pump-out slots concentrically surrounding the air bearing orifice, and by concentrically surrounding the outer pump-out slot with a sealing sheet which confines air escaping from outside the pump-out slots to within the perimeter of the sealing sheet. The sealing sheet is a compliant mechanical "wall", making only marginal contact with the bearing support surface, and is not a high friction seal. Hence free movement of the air bearing structure on the supporting surface is allowed, thus making this air bearing compatible with for instance an XY stage used in a vacuum chamber.

25 Claims, 6 Drawing Sheets

AIR BEARING OPERABLE IN A VACUUM REGION

FIELD OF THE INVENTION

This invention relates to a bearing and more specifically to a fluid bearing operable in conjunction with a vacuum system.

BACKGROUND

Differentially pumped air bearing systems are known; see for instance Fox U.S. Pat. No. 4,191,385 issued Mar. 4, 1980 and Lewis et al. U.S. Pat. No. 4,425,508 issued Jan. 10, 1984. Present FIG. 1, identical to FIG. 2 of Lewis et al., shows in a plan view the top of the air bearing structure which supports a moving planar surface (not shown, see Lewis et al.). The air bearing plate 17 defines around its periphery a plurality of H-shaped grooves 41. The groove pattern follows the outer perimeter of the bearing plate 17, in a square contour with rounded corners. At the middle of the cross-bar of each H-groove there is a metering valve 42 which controls and limits the flow of air into that groove. Air under pressure is provided to the H-shaped grooves through the metering valves 42 from a manifold (not shown) and this air flow provides an air cushion between the face of the plate 17 and the opposing face of the bearing surface (not shown). This structure is intended for use in a vacuum chamber, for instance in an electron beam lithography system. Since some of the air from the air bearing necessarily flows toward the evacuated area which is region 46, two pump-out slots 43 and 45 are located inboard of the groove 41. Pump-out slots 43 and 45 are provided with successively greater levels of vacuum pumping to scavenge the inwardly escaping air and prevent it from reaching vacuum region 46. The amount of escaping air is held to a minimum by observing close tolerances between the facing surfaces of the plate 17 and the opposing surface.

Hence this air bearing is separated from the vacuum region by the pump-out slots so that the air flowing into the bearing is pumped out through the pump-out slots before it can reach the central vacuum region enclosed by the pump-out slots. Typically a moving stage is supported by this bearing for XY movement, where the XY movement with regard to FIG. 1 is in the plane of the drawing. The pressure in the vacuum region 46 is maintained by conventional vacuum pumps. To maintain that pressure, the pumping capacity of the pumps must be adequate to handle the added burden of the air (or other gas) escaping from the air bearing. Hence it is recognized that it is advantageous to reduce the air flow to the vacuum, and hence in FIG. 1 there are two pump-out slots.

Moreover, the air from the air bearing flows through the gap between the plate 17 and the opposing bearing surface on which it rides. Since this gap is very small, the air flow to the vacuum region is advantageously reduced. However, the smaller the gap the tighter the necessary mechanical tolerance on the bearing plate 17 and the opposing surface, which substantially increases the manufacturing costs. A typical air bearing gap is 5 microns ($\mu$m) which requires precision machining over a relatively large surface area; this substantially increases manufacturing costs, especially because two such large precision machined bearing surfaces are needed. Since the bearing stiffness is a function of this gap, adjusting the gap purely to control the air flow is often impractical. Hence an air bearing suitable for use in a vacuum (not just surrounding a vacuum) and which is also economical to fabricate is needed.

SUMMARY

In accordance with this invention, an air (or other gas) bearing with pump-out slots is arranged so that the pump-out slots surround the air bearing outlet. Moreover, in one embodiment, the pump-out slots are further concentrically surrounded by a wall structure which has a sealing function. This wall structure is a low friction structure which does not impede motion of the stage which is riding on the air bearing. At the outer pump-out slots, the air pressure is (in one embodiment) low enough ("rarefied") so that the air may be in the molecular regime (meaning that its mean freepath is much greater than mechanical system dimensions). The air pressure has to be just low enough not to "blow" the seal out of place. Hence at that point the force against the wall structure from the impinging gas molecules in the air escaping from the air bearing is negligible, so the wall structure can be very light. It may or may not contact the bearing surface, but if it does, the frictional forces are very low. The wall structure thereby does not impede stage motion, while causing a gas molecule to be more likely to bounce off the wall into a pump-out slot rather than escape into the surrounding vacuum region.

Because of the basic properties of the sealing wall, the wall structure embodiment is applied most appropriately to gas bearings. However it can be applied advantageously to fluid bearings under the following conditions. If the fluid bearing is so designed as to provide successful scavenging of the fluid, similar to the gas bearing described above, some vapor of the fluid will typically remain, its pressure being related to the vapor pressure of the fluid. Provided the vapor pressure is not excessive (some vapor pumpout slots may be required), the sealing wall can reduce this pressure to a tolerable level in the vacuum system.

The present wall structure differs from conventional flexible vacuum seals (e.g. O-rings) which bear directly against the opposing surface and hence impede movement. Hence the present bearing is suitable for fast precise motion while still maintaining the vacuum surrounding the air bearing. Moreover, unlike the FIG. 1 structure, the present bearing is useful where a plurality of individual bearings are each located in a vacuum region.

In one embodiment, channels for venting the gas are defined in the bearing to allow the gas to be vented to atmosphere (or to outside the vacuum environment.) This enables the present air bearing to operate similarly to air bearings in a non-vacuum environment.

Since in accordance with this invention the force on the wall structure is negligible, the wall itself can be very light, thereby offering little resistance to stage motion. For instance, such a wall structure can be fabricated using semiconductor type processing technology, e.g. from silicon or thin metal films, thereby providing a light flexible structure. For instance the wall structure may be a thin sheet mounted at the end of a relatively long flexible cantilever with a weak spring constant, so that any frictional force that the wall structure exerts on the opposing bearing surface as the wall moves is negligible. It may be composed of silicon or silicon compounds or metal.

BRIEF DESCRIPTION OF THE DRAWINGS

FIG. 6B shows detail of FIG. 6A.

DETAILED DESCRIPTION

Figure 2A:
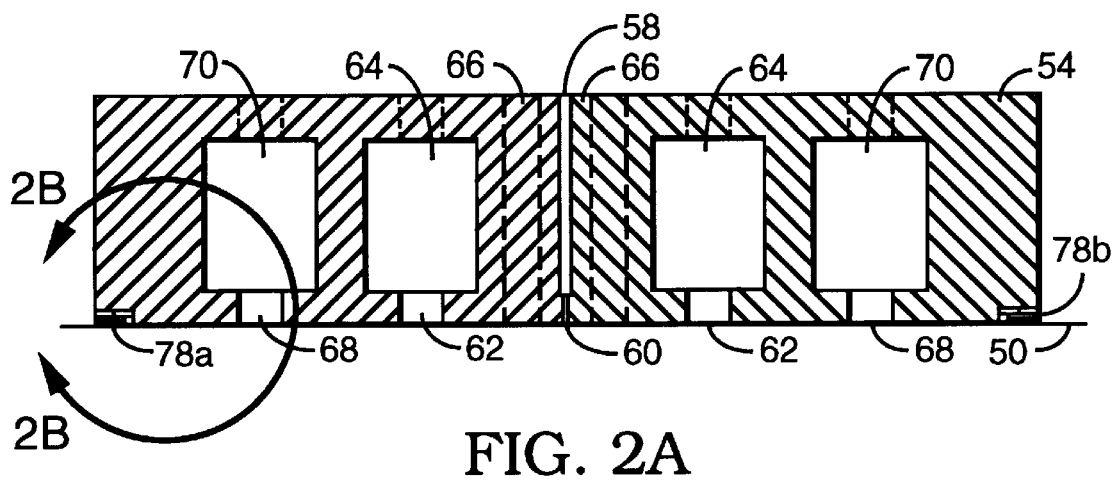
FIG. 2A shows in cross section an embodiment of the present air bearing structure.

FIG. 2A shows in cross section an air bearing assembly in accordance with this invention. Air (or other suitable fluid) is supplied under pressure from a conventional source through passage 58 provided in air bearing structure 54. Passage 58 terminates in a small diameter orifice 60 which opposes the substrate 50, which is the surface upon which air bearing structure 54 rides. It is understood that for instance an XY stage (not shown) is attached to the upper portion of air bearing structure 54. Of course the present invention is not limited to fluid bearings for stages, and moreover is not limited to bearings where a planar surface rides on another planar surface; it is also applicable to journalled shaft-type fluid bearings where a round or rectangular shaft rides in a cylindrical or rectangular bearing structure. An application of such bearings is described in M. Ohsuka et al, SME International Journal, Series III, Vol. 33, 61 (1990).

The air exits through orifice 60 and is distributed radially (to the left and right in the drawing). Alternative sources of air to the bearing exist, such as slots or a porous region through which air diffuses. (In other embodiments, there are two or more orifices 60.) This air bearing structure is intended for use in a vacuum region which is located, for instance, surrounding (to the left and right in the drawing) the air bearing structure 54. Therefore it is desirable to prevent the escaping air from orifice 60 from reaching the vacuum region, so as to minimize the pumping requirements of the vacuum pumps. Hence pump-out slots 62 and 68 are provided, each being concentric to orifice 60 as shown. The inner pump-out slot 62 communicates with portion 64 of an air pump-out manifold and the outer pump-out slot 68 communicates with portion 70 of the air pump-out manifold.

Optionally, air vent passage 66 allows the air to be vented to atmosphere (or communicated outside the vacuum environment by a tube, not shown). This enables the present air bearing to operate similarly to air bearings in a non-vacuum environment.

Differential vacuum pressures are applied to manifold portions 64 and 70; a higher vacuum is vented at the outer pump-out slot 68 than at the inner pump-out slot 62. (In other embodiments there is only one pump-out slot, or more than two pump-out slots.) Also, since the input air to the bearing is typically supplied at a pressure higher than 1 atmosphere, a separate slot may be provided in board of the pump-out slots, which allows the air to escape to the room air surrounding the vacuum system. The amount of pump-out is such that the actual air pressure immediately outside pump-out slot 68 (between bearing structure 54 and substrate 50) is negligible as described above, i.e. the gas at that point can be in the molecular regime. Although the gas pressure at this point is very low, as far as the bearing properties are concerned it may still be higher than that of the surrounding vacuum, so it is still desirable to prevent any of that gas if possible from escaping into the surrounding vacuum region. Hence in accordance with the invention a wall structure 78 is provided; due to the nature of the drawing this is shown having two portions 78a and 78b but it is to be appreciated that typically this is a single seal structure concentric to the outer pump-out slot 68. Wall structure 78 need not be located at the very edge of air bearing structure 54, contrary to what is depicted in this illustrative embodiment.

The sealing wall provides greater isolation from the bearing than simple vacuum pumping calculations would predict. Because the air pressure around the outer ring may be in the molecular regime, the mean free path of the molecules entering the outer groove region from the inner part of the bearing are unlikely to collide before passing beyond the groove. Moveover, their predominant direction of motion will be radially outward, because of the geometry of the bearing surfaces; the molecules are channeled between the upper and lower bearing surfaces, so they travel almost horizontally. If the pressure were higher, the molecules would scatter in all directions, and the likelihood that some would scatter in the direction of the outer groove would be substantial, so pumping through the groove would be efficient. In the present case, pumping efficiency is low, so the sealing wall plays a more important role than might be initially expected. This phenomenon is well known in vacuum technology and is known as "beaming".

Figure 2B:
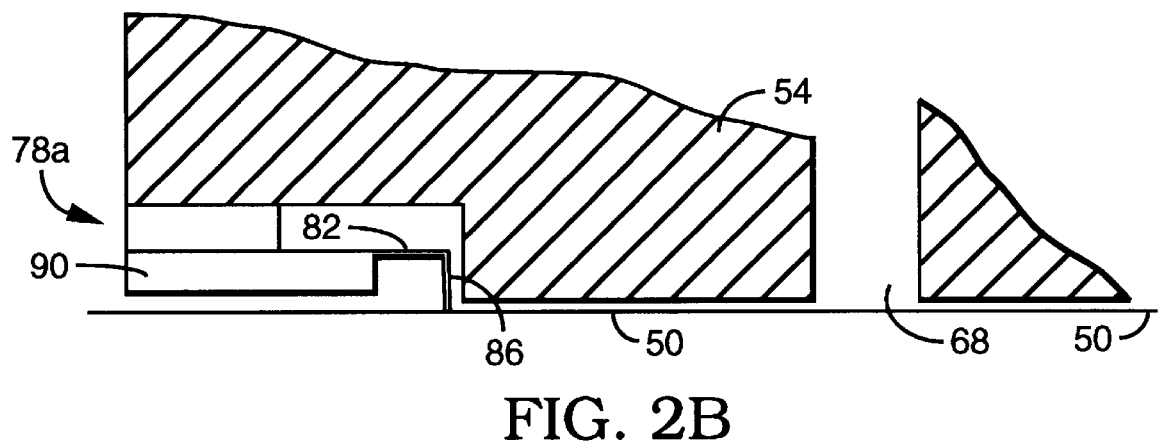
FIG. 2B shows an enlarged view of portion 78a of FIG. 2A.

Detail of portion 78a of the wall structure is shown in FIG. 2B (denoted by the circle labelled 2B in FIG. 2A). The structures in FIG. 2B having similar reference numbers to those of FIG. 2A identical structures. Further detail of the wall structure 78a depicted in FIG. 2B includes the sealing sheet (wall) 86 which is supported by flexible cantilever 82 on mounting structure 90. Mounting structure 90 is typically mounted (adhesively or by other types of fastening) to the undersurface of bearing structure 54. In this case the sealing sheet 86, shown in a side view, appears as a very thin wall. Sealing sheet 86 is, e.g. a thin sheet of silicon or a compound of silicon or metal, mounted at the end of the relatively long flexible cantilever 82. Sealing sheet 86 has a thickness e.g. of tens to hundreds of $\mu$m in a silicon version. The spring constant of the cantilever 82 is weak, so the frictional force that the sealing sheet 86 exerts on the underlying substrate 50, as the bearing structure 54 moves relative to it, is negligible. The sealing sheet 86 may or may not actually touch the surface 50. For instance, it may "bounce" along surface 50 due to slight irregularities in the surface 50 as bearing structure 54 moves, in one embodiment.

Figure 2C:
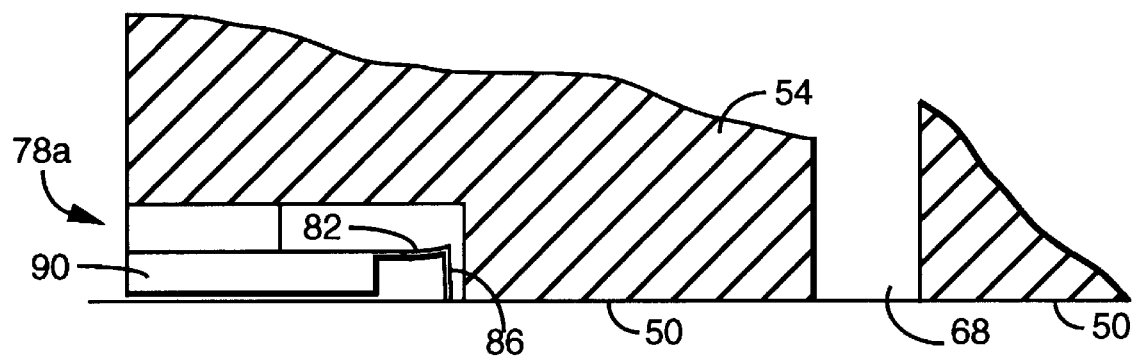
FIG. 2C shows the structure of FIG. 2B with the cantilever flexed.

FIG. 2C shows the structure of FIG. 2B, however with cantilever 82 slightly flexed up, because the air bearing is "grounded" on the substrate, an occasional bearing condition. The cantilever is not damaged, however, because of its flexibility.

In one embodiment the sealing sheet 86, its supporting cantilever 82, and mounting structure 90 are one integral structure, e.g. of silicon, a silicon compound or metal. For instance, well known semiconductor processing technology can be used to micromachine such structures. In one case, the cantilever 82 is a silicon beam and the sealing sheet 86 is a thin silicon structure depending from cantilever 82. Mounting structure 90 is also of silicon. The construction of the cantilever 82 and sealing sheet 86 and mounting structure 90 may be similar to that of cantilever probes used for instance in scanning tunneling microscopy which can be fabricated entirely from silicon or silicon compounds by micromachining. The spring constant of cantilever 82 and its dimensions depend on the application, for instance the bearing size and the intended bearing gap. The cantilever 82 and sealing sheet 86 are for instance, alternatively, formed by metal film deposition on a micromachined silicon substrate, with micromachining of the resulting thin metal structure.

Figure 3A:
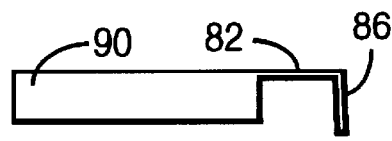
FIG. 3A shows the cantilever and wall structure in a side view, corresponding to the view of FIG. 2B.
Figure 3B:
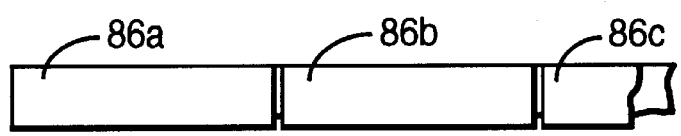
FIG. 3B shows a front view of the structure of FIG. 3A.
Figure 3C:
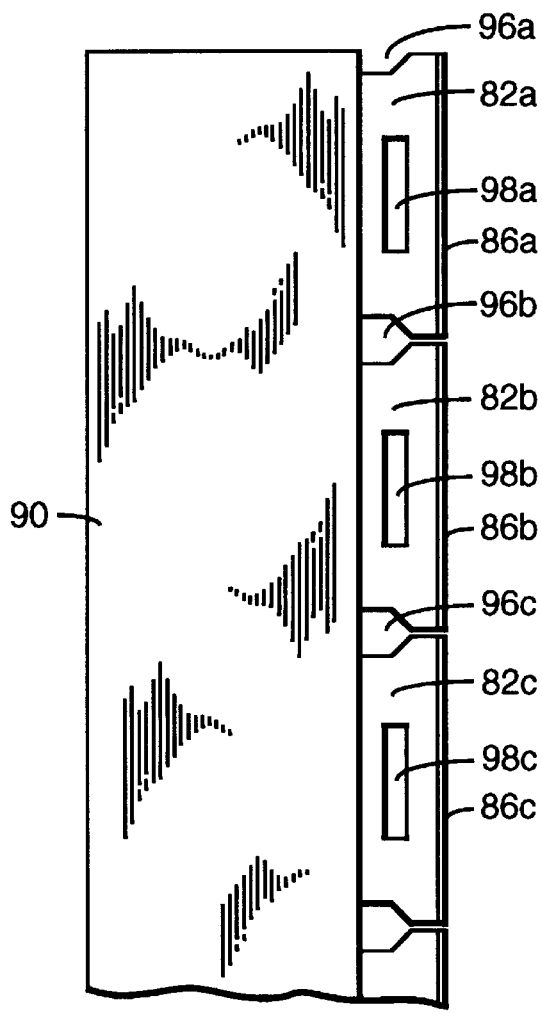
FIG. 3C shows a plan view of the structure of FIG. 3A.
Figure 3D:
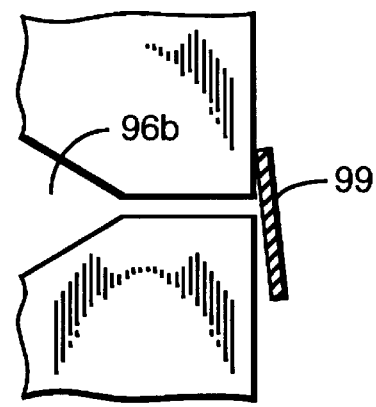
FIG. 3D shows detail of the structure of FIG. 3C.

FIG. 3A shows structures identical to those of FIG. 2C without the air bearing structure 54. FIG. 3A is a side view; a front view of the same structure is shown in FIG. 3B, showing the sealing sheet 86 divided into several portions (of which only three portions 86a, 86b and a part of third portion 86c are illustrated). FIG. 3B shows slots between the portions 86a, 86b, 86c of the sealing sheet which add to its flexibility. These slots are quite narrow so that a gas molecule is unlikely to escape through them, however, the occasional escaping gas molecule is not problematic. As the enlargement FIG. 3D shows, further molecular containment is possible by overlapping each of the slots by a baffle 99. A plan view of the structure of FIGS. 3A and 3B is shown in FIG. 3C, illustrating cutouts 98a, 98b, 98c, and slots 96a, 96b, 96c formed in the cantilever 82 between portions 86a, 86b and 86c. These slots and cutouts increase the cantilever flexibility.

The spring constant of the cantilever structure 82 is weak and its mass is insignificant, so the frictional force that the sealing sheet 86 exerts on the substrate 50 as the bearing structure 54 moves is negligible. Moreover, if the tip is coated with a thin layer of e.g. $Si_3N_4$ (provided by semiconductor processing techniques) its surface will be far harder than any metal, so wear will be negligible.

Figure 1:
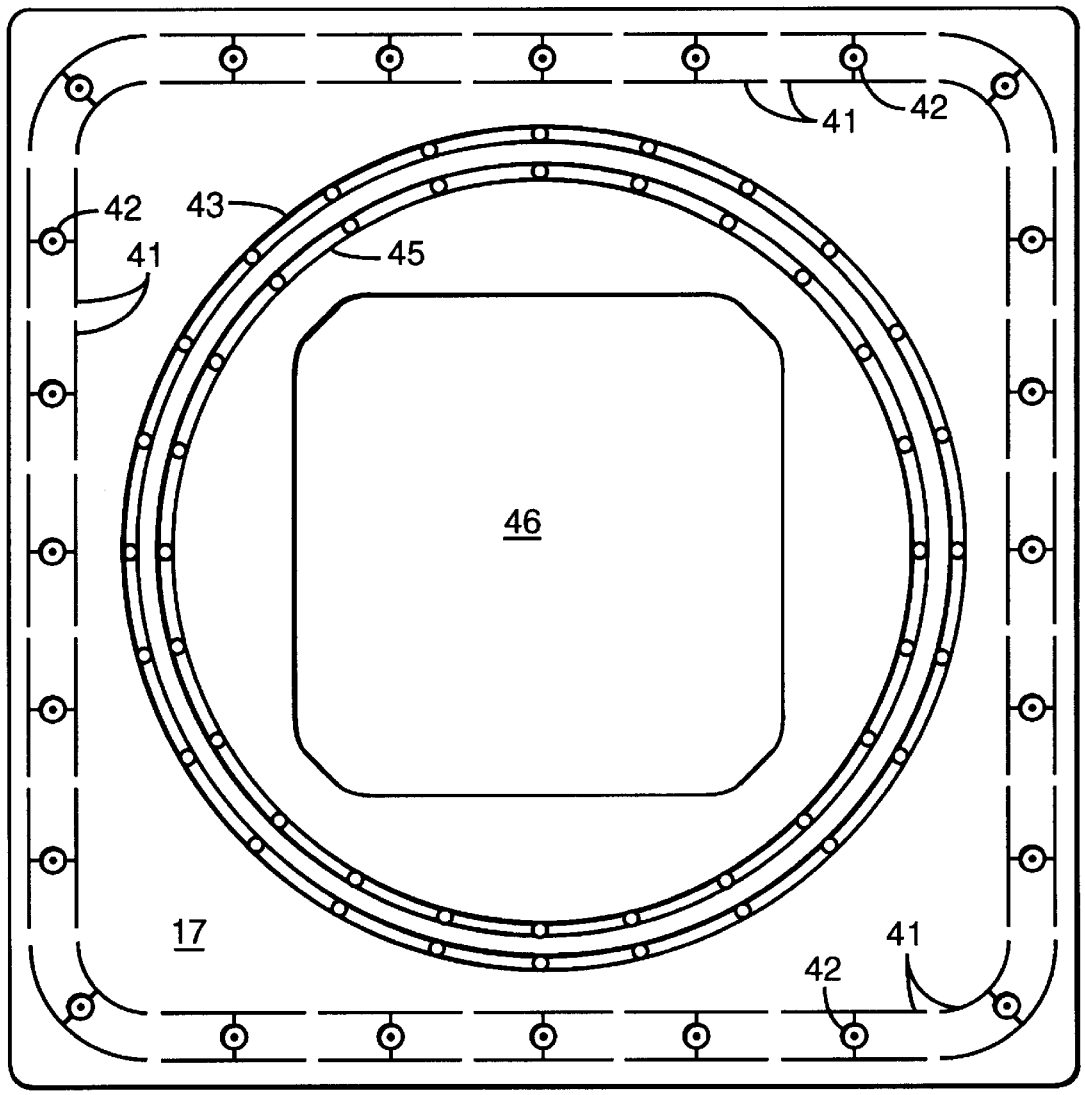
FIG. 1 shows a known air bearing structure in a plan view.
Figure 4:
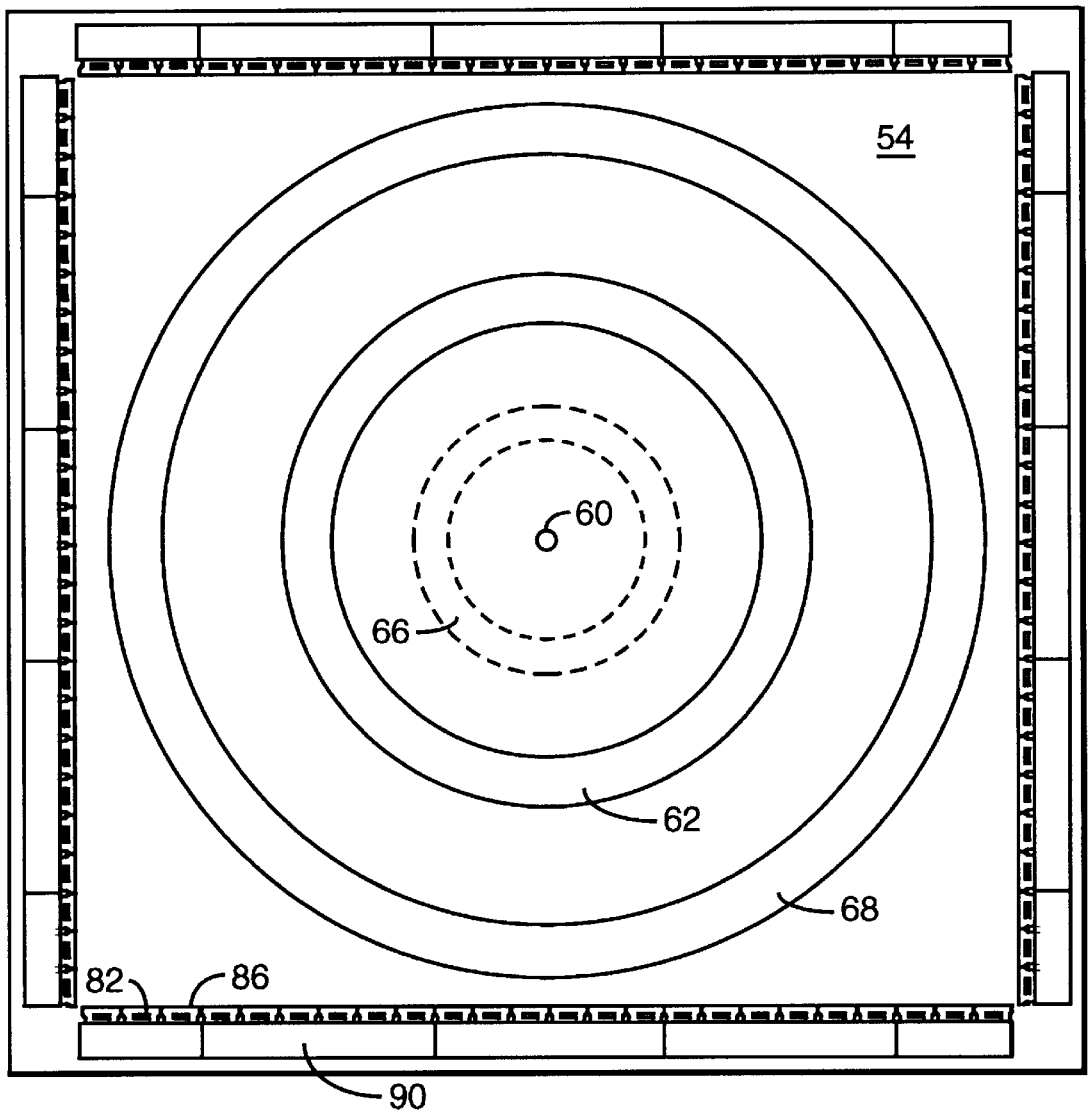
FIG. 4 shows an embodiment of the present air bearing structure in a plan view.

FIG. 4 shows a plan view of an embodiment of the present air bearing, which thereby corresponds to the view of FIG. 1. FIG. 4 uses identical reference numbers as FIG. 2A. Here details of the sealing sheet 86 are shown, corresponding to the cutouts and slots shown in FIG. 3C. The sealing sheet 86 extends concentrically around the outer pump-out slot 68. While none of the drawings are to scale, in one embodiment the structure depicted in FIG. 4 measures, e.g., approximately 2" by 2". Of course, multiple air bearing assemblies of the type shown in FIG. 4 are typically provided to support one stage. Advantageously, each such air bearing structure is isolated from the surrounding vacuum region, rather than the FIG. 1 approach where the air bearings as a group are isolated from a central vacuum region. The sealing sheet 86 of FIG. 4 extends all the way around the outer perimeter of outer pump-out slot 68. Sealing sheet 86 may be one continuous structure or may be fabricated from several structures, each one of which is linear. A variety of such modifications to the actual construction are within the scope of this invention.

Figure 5:
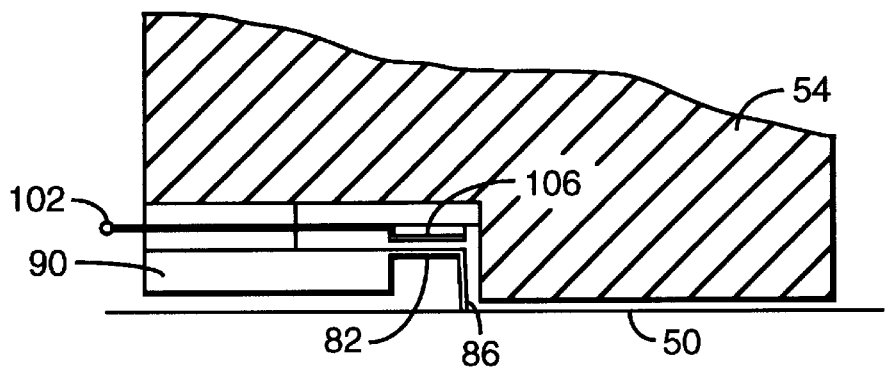
FIG. 5 shows another embodiment of the present air bearing structure with electrical control of the wall structure position.

The air bearing of FIG. 4 is intended to move in both the X and Y directions, i.e. in the two dimensions defined by the plane of the drawing. If the air bearing moves perpendicular to the plane of a particular sealing sheet, (X direction) the sealing sheet moves up and down relative to surface 50, possibly bumping over any surface 50 irregularities (bumps). For motion in a direction parallel to the length of a sealing sheet, (Y direction) the cantilever may be twisted out of position by such bumps, possibly damaging it. To overcome this possible problem, the structure of FIG. 5 is provided, to dynamically control the vertical position of each sealing sheet. This is done by providing an electrode 106 on the bottom surface of a plate mounted on bearing structure 54 just above the cantilever 82.

The electrode 106 is in electrical contact with an electric voltage supply terminal 102 to which a voltage is applied. The cantilever 82 is electrically grounded. Hence an electrostatic attractive force is created by application of voltage to terminal 102, which moves the cantilever 82 upwards in the drawing, thus lifting the sealing sheet 86 away from the surface 50. In one example, whenever the stage is moving in a direction in which the cantilever may be damaged, the cantilever is raised by this lifter mechanism (using an electrical control system) to avoid such damage. During this raising period of course some extra air leakage might occur. However the amount of vertical lift is relatively small, merely enough to avoid bumping on the surface 50 irregularities so significant leakage is unlikely.

Figure 6A:
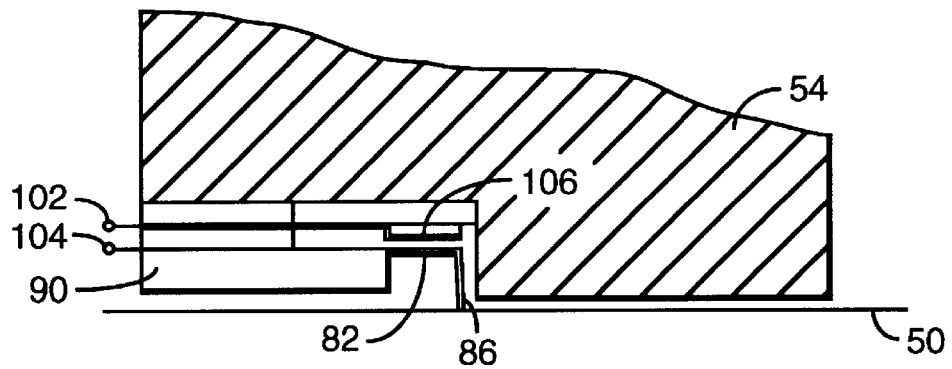
FIGS. 6A, 6B show a variation of the FIG. 5 structure.
Figure 6B:
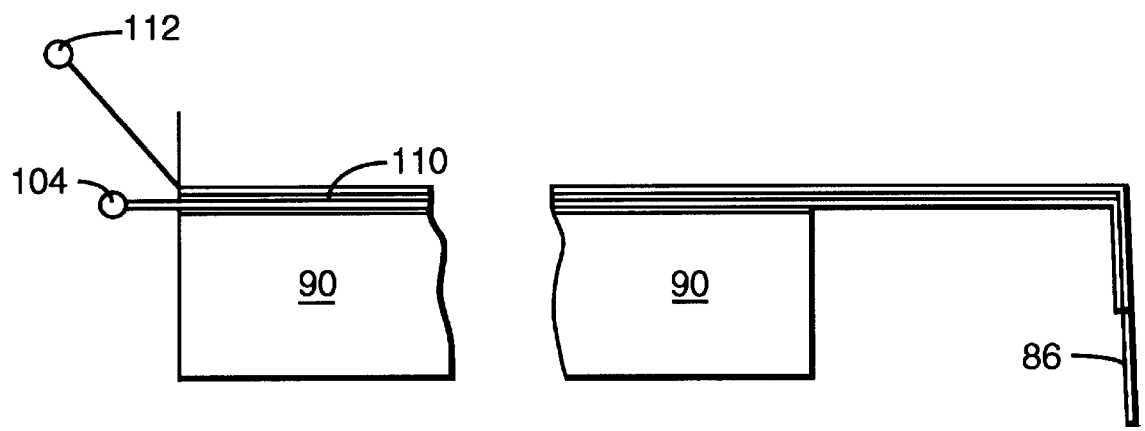

A more sophisticated control of the cantilever height is possible as shown in FIGS. 6A, 6B. While the upper surface of the cantilever 82 is grounded by lead 112, the lower part of the sealing sheet 86 is insulated, and the bottom of the sheet 86 is electrically conductive and connected to a second electrode 104 via conductor (see FIG. 6B). If the bearing substrate 50 is electrically conductive (either a metal or an insulator covered with a thin electrically conductive film), then a voltage bias on electrode 104 will cause a current to flow, if the sheet 86 is in contact with the substrate 50 surface. Detection of this current by a suitable sensor therefore allows the minimum amount of attractive potential on electrode 102, to lift the sheet from the substrate, to be determined. These voltage settings can be determined as part of a bearing setup procedure.

The "flying" height of the sheet 86 can also be monitored in real time by several means. For example the height can be determined by monitoring the capacitance between the sheet and the substrate. It is also possible to measure the electron tunneling current between the closest point of the sheet to the substrate and the substrate. This current flows only when the sheet and the substrate are separated by nanometers. Under these conditions the sheet and substrate can be regarded as making a mechanical seal as far as molecular flow into the vacuum from the bearing is concerned, and the quality of the seal is determined by the local flatness of the substrate and the sheet.

In accordance with this invention, advantageously the mechanical fabrication tolerances between the air bearing housing 54 and the substrate 50 on which it rides can be increased, hence substantially decreasing manufacturing costs. This is because the effective surface area of the air bearing is minimized and only the two actually bearing surfaces need be closely machined. In other words, the bearing surface is localized to the area inside the perimeter sealing sheet 86 shown in FIG. 4; outside that region the bearing surface of structure 54 need not be as closely machined.

For application to a journal type air bearing, the above considerations are not relevant. These bearings permit only one-dimensional motion, so the sealing sheets are always perpendicular to the bearing motion.

Figure 7:
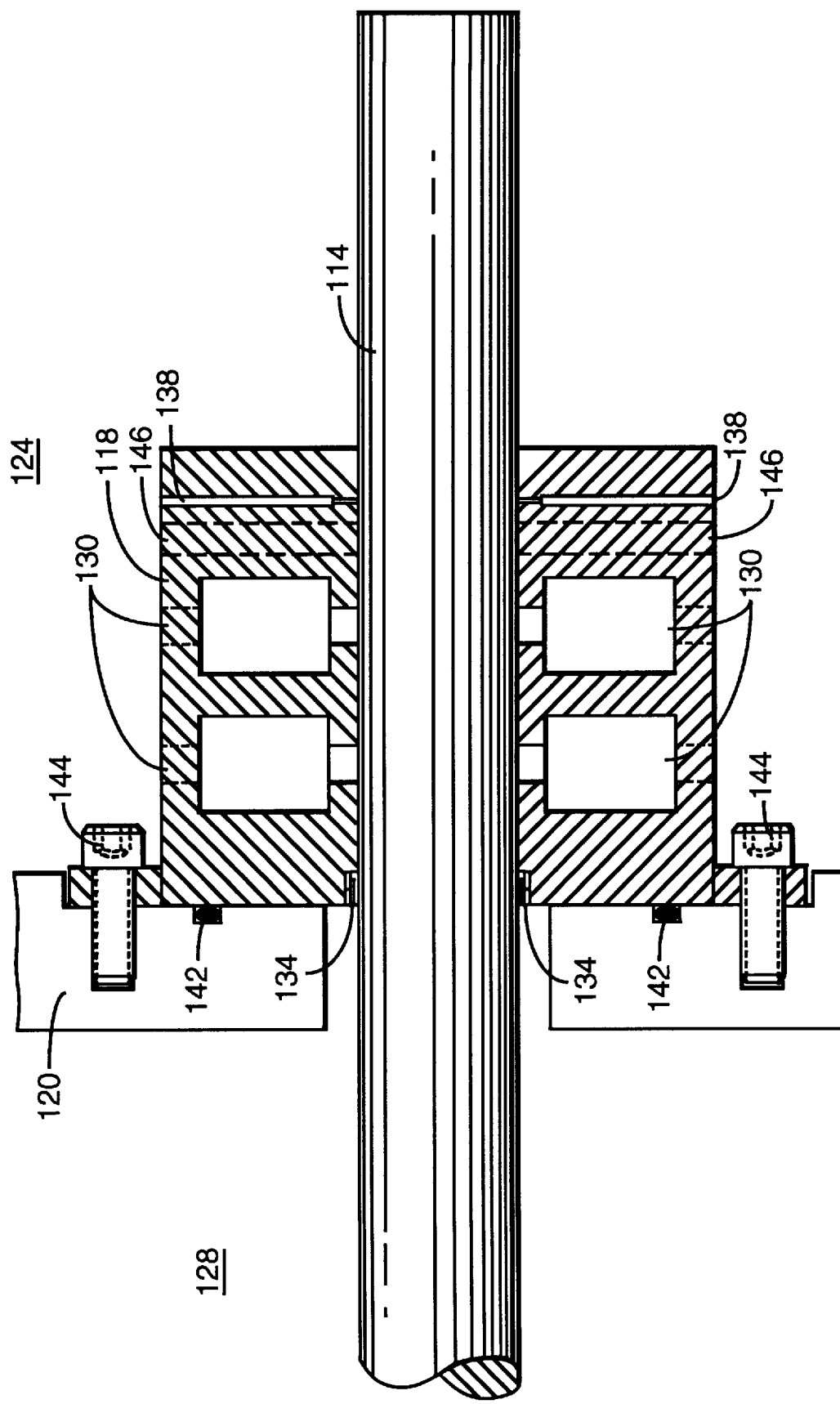
FIG. 7 shows a shaft air bearing structure.

An embodiment of such a journal type bearing is shown in FIG. 7 in cross section. The shaft 114 runs through an air bearing 118 installed in the wall 120 of a vacuum vessel 128, so that one end of the shaft 114 is in air 124 and the other end is within the vacuum 128. The end of the shaft 114 in the air may be connected to a motor or other actuator, while the opposite end of the shaft 114 may be connected to a stage or other movable structure. Differential pumping grooves 130 on the vacuum 128 side of the air bearing 118 reduce the pressure to a near molecular flow regime, and the sealing wall structure 134 then reduces the flow into the chamber to a level where a satisfactory vacuum level can be maintained without exorbitant pumping requirements. Air input orifice 138 is formed in air bearing 118. O-ring 142 seals in vacuum 128. Screws 144 fasten bearing 118 to vessel wall 120. Vent passage 146 has the same function as vent passage 66 in the FIG. 2A embodiment.

This disclosure is illustrative and not limiting; further modifications will be apparent to one skilled in the art in the light of this disclosure and are intended to fall within the scope of the appended claims.

What is claimed:

1. A gas bearing assembly for bearing on a surface, the assembly comprising:

a bearing structure defining at least one orifice for directing gas towards the surface, the bearing structure having a bearing surface opposing the surface, and the orifice extending to the bearing surface;

a gas output passage defined in the bearing structure and extending to the bearing surface adjacent the orifice, for conducting gas supplied through the orifice away from the bearing surface; and a flexible structure coupled to the bearing structure and extending towards the surface, the gas output passage being located intermediate the flexible structure and the orifice, wherein at the gas output passage the gas is rarefied to be in the molecular regime.

2. The assembly of claim 1, wherein the gas output passage surrounds the orifice at the bearing surface, and wherein the flexible structure is concentric to the gas output passage at the bearing surface.

3. The assembly of claim 1, wherein the flexible structure is selected from the group consisting of silicon, a silicon compound, and a metal.

4. The assembly of claim 1, further comprising a vacuum source connected to the gas output passage.

5. The assembly of claim 1, further comprising a gas source connected to the orifice.

6. The assembly of claim 1, wherein there is a lower pressure of the gas on a side of the flexible structure distal from the orifice.

7. The assembly of claim 1, wherein the flexible structure is coupled to the bearing structure by a flexible cantilever.

8. The assembly of claim 7 wherein the cantilever and flexible structure are integral to one another.

9. The assembly of claim 1, further comprising a mechanism for moving the flexible structure away from the surface.

10. The assembly of claim 1, wherein the flexible structure is a seal.

11. The assembly of claim 1, wherein the bearing structure is concentric to a shaft, the surface being a surface of the shaft.

12. The assembly of claim 1, further comprising at least one vent passage defined in the bearing structure for venting the gas supplied through the orifice external to the bearing structure.

13. The assembly of claim 1, wherein the flexible structure is spaced apart from the surface.

14. The assembly of claim 1, wherein a thickness of the flexible structure is less than 200 $\mu$m.

15. A gas bearing assembly for bearing on a surface, the assembly comprising:

a bearing structure defining at least one orifice for directing gas towards the surface, the bearing structure having a bearing surface opposing the surface, and the orifice extending to the bearing surface;

a gas output passage defined in the bearing structure and extending to the bearing surface adjacent the orifice, for conducting gas supplied through the orifice away from the bearing surface; and a flexible structure coupled to the bearing structure and extending towards the surface, the gas output passage being located intermediate the flexible structure and the orifice, wherein at the gas output passage the gas is rarefied to be in the molecular regime;

wherein the flexible structure is coupled to the bearing structure by a flexible cantilever, and wherein the cantilever defines a plurality of cut outs.

16. The assembly of claim 15, wherein the flexible structure defines a plurality of slots.

17. A gas bearing assembly for bearing on a surface, the assembly comprising:

a bearing structure defining at least one orifice for directing gas towards the surface, the bearing structure having a bearing surface opposing the surface, and the orifice extending to the bearing surface;

a gas output passage defined in the bearing structure and extending to the bearing surface adjacent the orifice, for conducting gas supplied through the orifice away from the bearing surface;

a flexible structure coupled to the bearing structure and extending towards the surface, the gas output passage being located intermediate the flexible structure and the orifice, wherein at the gas output passage the gas is rarefied to be in the molecular regime; and a mechanism for moving the flexible structure away from the surface wherein the mechanism includes an electrode coupled to the bearing structure for electrically attracting the flexible structure away from the surface.

18. A gas bearing assembly for bearing on a surface, the assembly comprising:

a bearing structure defining at least one orifice for directing gas towards the surface, the bearing structure having a bearing surface opposing the surface, and the orifice extending to the bearing surface;

a gas output passage defined in the bearing structure and extending to the bearing surface adjacent the orifice, for conducting gas supplied through the orifice away from the bearing surface;

a flexible structure coupled to the bearing structure and extending towards the surface, the gas output passage being located intermediate the flexible structure and the orifice, wherein at the gas output passage the gas is rarefied to be in the molecular regime;

a mechanism for moving the flexible structure away from the surface;

wherein the mechanism includes an electrode coupled to the bearing structure for electrically attracting the flexible structure away from the surface; and a sensor arranged to locate a proximity of the bearing structure to the surface.

19. A gas bearing assembly for bearing on a surface, the assembly comprising:

a bearing structure defining at least one orifice for directing gas towards the surface, the bearing structure having a bearing surface opposing the surface, and the orifice extending to the bearing surface;

a gas output passage defined in the bearing structure and extending to the bearing surface adjacent the orifice, for conducting gas supplied through the orifice away from the bearing surface;

a flexible structure coupled to the bearing structure and extending towards the surface, the gas output passage being located intermediate the flexible structure and the orifice, wherein at the gas output passage the gas is rarefied to be in the molecular regime; and at least one vent passage defined in the bearing structure for venting the gas sup-plied through the orifice external to the bearing structure, the gas output passage being located intermediate the flexible structure and the orifice;

wherein the vent passage is located intermediate the orifice and the gas output passage.

20. A method of bearing a structure on a surface, comprising:

directing a flow of gas through the structure to the surface;

conducting the gas away from the surface back through the structure;

enclosing the gas into a predetermined region between the surface and the structure by a structure extending towards the surface from the structure; and maintaining a pressure differential of the gas between the predetermined region and other regions external to the predetermined region;

wherein in the predetermined region the gas has a pressure such that the gas is rarefied to be in the molecular regime.

21. The method of claim 20, wherein the structure is spaced apart from the surface.

22. The method of claim 20, wherein a thickness of the flexible structure is less than 200 μm.

23. A gas bearing assembly for bearing on a surface, the assembly comprising:

a bearing structure defining at least one orifice for directing gas towards the surface, the bearing structure having a bearing surface opposing the surface, and the orifice extending to the bearing surface;

a gas output passage defined in the bearing structure and extending to the bearing surface surrounding the orifice at the bearing surface, for conducting gas supplied through the orifice away from the bearing surface, wherein a pressure of the gas at the bearing surface within a region defined by the gas output passage is higher than outside the region; and an additional gas output passage which is concentric to the first gas output passage.

24. The assembly of claim 23, further comprising a flexible structure coupled to the bearing structure and extending towards the surface, the gas output passage being located intermediate the flexible structure and the orifice.

25. A method of bearing a structure on a surface, comprising:

directing a flow of gas through the structure to the surface;

conducting the gas away from the surface back through the structure; and maintaining a pressure differential of the gas between a predetermined region intermediate the surface and the structure and other regions external to the predetermined region;

wherein in the predetermined region the gas has a pressure such that the gas is in the molecular regime.

* * * * *

UNITED STATES PATENT AND TRADEMARK OFFICE
CERTIFICATE OF CORRECTION

PATENT NO.    : 6,126,169
DATED         : October 3, 2000
INVENTOR(S)   : Michael R. Sogard et al.

It is certified that error appears in the above-identified patent and that said Letters Patent is hereby corrected as shown below:

Column 9,
Line 7, please delete "sup-plied" and insert -- supplied --.

Signed and Sealed this

Eleventh Day of February, 2003

JAMES E. ROGAN
*Director of the United States Patent and Trademark Office*